(12) United States Patent
Gennari et al.

(10) Patent No.: US 8,832,621 B1
(45) Date of Patent: Sep. 9, 2014

(54) TOPOLOGY DESIGN USING SQUISH PATTERNS

(75) Inventors: Frank E. Gennari, San Jose, CA (US); Ya-Chieh Lai, Mountain View, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 171 days.

(21) Appl. No.: 13/305,669

(22) Filed: Nov. 28, 2011

(51) Int. Cl.
 *G06F 17/50* (2006.01)
(52) U.S. Cl.
 USPC .......................................................... 716/112
(58) Field of Classification Search
 CPC .. G06F 17/5081; G06F 17/5068; G06F 17/50
 USPC ........................................................ 716/112
 See application file for complete search history.

(56) References Cited

U.S. PATENT DOCUMENTS

| | | | |
|---|---|---|---|
| 7,653,892 B1 * | 1/2010 | Gennari et al. | 716/50 |
| 7,707,542 B1 * | 4/2010 | Gennari et al. | 716/50 |
| 2003/0159120 A1 * | 8/2003 | Baader et al. | 716/5 |
| 2005/0060672 A1 * | 3/2005 | Poechmueller | 716/2 |
| 2009/0271749 A1 * | 10/2009 | Tang et al. | 716/5 |
| 2009/0307642 A1 * | 12/2009 | Lai et al. | 716/5 |

* cited by examiner

*Primary Examiner* — Vuthe Siek
*Assistant Examiner* — Aric Lin
(74) *Attorney, Agent, or Firm* — Kenyon & Kenyon LLP

(57) ABSTRACT

A system and method for evaluating a design layout by identifying squish patterns for configurations of shapes in windows defined for anchors in the layout, identifying deltas between edges of elements in the windows and reducing each delta to a single width are described. Identified squish patterns may be compared to known patterns to determine if the squish pattern is a known good or bad pattern. A squish pattern may be represented by a pixel map such that each pixel is a reduced delta in the window and each pixel has a bit representing a layer in a multi-layer layout. A plurality of stored squish patterns may be searched to identify a matching squish pattern, a specific configuration of the squish pattern, or configurations of the squish pattern having deltas within a specified range.

19 Claims, 9 Drawing Sheets

100

200

600

800

900

1000

TOPOLOGY DESIGN USING SQUISH PATTERNS

BACKGROUND

Aspects of the present invention relate generally to the field of integrated circuit design, and more specifically to pattern identification and classification.

Design rule based validation of integrated circuits has been accomplished with the assistance of a design rule check (DRC) process. The design rule check (DRC) process helps minimize manufacturing problems by ensuring that the circuit design abides by a set of detailed rules and parameters. During DRC, a layout is examined for violations of the defined design rules. When a circuit feature is located within the layout that violates a particular design rule, the violation is flagged or otherwise brought to the designer's attention.

However, the DRC process often uses design rules that are too constricting in order to conform to the "lowest common denominator" of acceptable layout design, and are otherwise difficult to implement correctly. Drafting or editing a set of design rules to avoid overly restricting design rules of more general applicability for each layout is time consuming and inefficient.

Accordingly, there is a need in the art for efficient identification of patterns in a complex layout such that the pattern based validation of a layout is scalable to a very large number of design rules and shape configurations.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

DETAILED DESCRIPTION

A squish pattern is a representation of a geometry or configuration of shapes that identifies unique topologies without specifying the dimensions of the shapes in the topology. A single topology represented by a squish pattern may reflect several different geometries or configurations.

Squish patterns may be identified for configurations in a layout by scanning the layout for anchors, and placing an identification window around the anchor. A squish pattern may be determined for a configuration of shapes contained by the identification window by identifying the deltas between scanlines containing an element edge in the identification window and reducing each delta to the same width. Once a squish pattern is identified, it may be stored in memory and associated with the layout. Then for every identification window that has a squish pattern consistent with the identified squish pattern, a record may be created detailing the original configuration and deltas.

Pattern recognition and classification techniques may then be used to validate the layout or to otherwise facilitate a search for known patterns. A single squish pattern may represent several different configurations; therefore, a search for any of those configurations in a layout may be limited to a search through the configurations associated with the squish pattern. Known good or bad patterns may be defined by a generic squish pattern, a specific configuration, or configurations having original deltas within a predetermined range.

Searching known pattern libraries for the squish patterns and associated configurations in the layout may facilitate pattern validation by identifying bad or unknown squish patterns. Known good pattern libraries may additionally facilitate the design of a layout by suggesting known good patterns associated with specific elements that may satisfy the desired parameters of a design.

Any design function that has been accomplished with pattern identification or design rule checking tools may be accomplished with squish pattern analysis and validation. DRC processes that involve complex design rules or multiple rules written to cover multiple different configurations having similar topologies may more efficiently be achieved with squish pattern analysis. Design rules may be implemented with squish patterns by defining a squish pattern and a set of allowed or forbidden deltas that describe allowed or forbidden configurations for that squish pattern, thereby restricting a specific configuration or a range of configurations similar to a restricted configuration with a single squish pattern rule.

Figure 1:
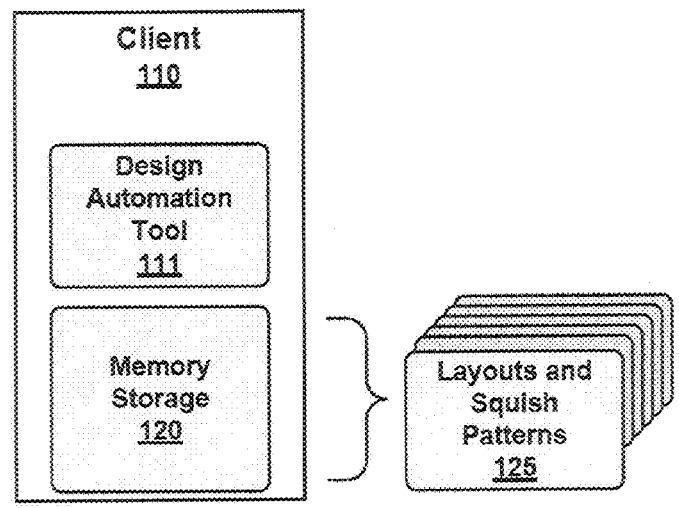
FIG. 1 is a simple block diagram illustrating components of an exemplary system according to an embodiment.

A user may access an integrated circuit design editor or other design layout tool utilizing squish pattern analysis and validation tools in a standalone client system, client-server environment, or a networked environment. FIG. 1 is a simple block diagram illustrating components of an exemplary system 100 according to an embodiment. As shown in FIG. 1, a system 100 may comprise a client 110 executing a design automation tool 111 and having a memory storage 120. The client 110 may be any computing system that executes a design automation tool 111 or otherwise facilitates access to memory storage 120 storing layouts and pattern libraries 125.

Layouts, pattern libraries, and other objects 125 utilized by the design automation tool 111 may be stored in memory storage 120. Pattern libraries stored in the memory storage device 120 may include a squish pattern library that identifies the various known squish patterns as well as records of squish patterns associated with stored and previously analyzed layouts.

A user may access the layouts and squish patterns 125 stored in memory storage 120 with the client 110 via a design automation tool 111 capable of accessing memory storage 120 and displaying the layouts 125 and related circuit design data stored therein. The design automation tool 111 may include a user interface, for example a program, application or middleware that acts as a frontend to and facilitates access to objects in memory storage 120, for example, a schematic or circuit design editor or other design editing application. The design automation tool 111 may facilitate an analysis of a design layout to identify squish patterns and perform squish pattern validation using the analysis and validation tools and procedures described herein. The user may interact with the design automation tool 111 through a number of input devices, such as by inputting a selection as with a mouse or inputting a request as with a keyboard. The user may observe the response to the access request on an output device or display. The design automation tool 111 may run in an application window controlled by the user.

As shown in FIG. 1, a client 110 may be a stand-alone system, as may be of particular interest where the designs being developed are highly confidential. Additionally, according to an aspect of an embodiment as shown in FIG. 2, a client 210 may be part of a networked environment.

Figure 2:
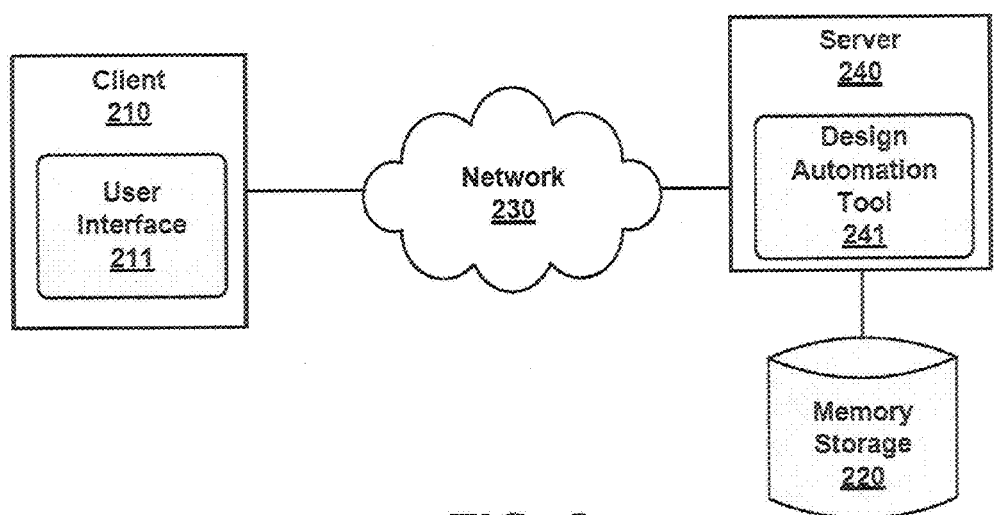
FIG. 2 is a simple block diagram illustrating components of an exemplary system according to an embodiment.

FIG. 2 is a simple block diagram illustrating components of an exemplary system 200 according to an embodiment. As shown in FIG. 2, system 200 may comprise a client 210 having a user interface 211. The client 210 may be connected to a server 240 via a network 230. The design automation tool 241 may have access to memory storage 220 storing layouts, pattern libraries, and other objects utilized by the design automation tool 241. A user may access a design automation tool 241 at the server via the client 210 having a user interface 211 capable of accessing and displaying stored layouts and pattern libraries. The client 210 may be any computing system that facilitates the user accessing memory storage 220. The network 230 may be a wired or wireless network that may include a local area network (LAN), a wireless area network (WAN), the Internet, or any other network available for accessing memory storage 220 from the client 210.

The server 240 may be a network server accessible to the client 210 via the network 230 that may manage access to memory storage 220. The user interface 211 may receive instructions regarding a layout design from the user and utilizing the pattern libraries stored in memory storage 220, facilitate a display of the layout design and the squish pattern analysis information. Multiple different clients (not shown) may access memory storage 220 via the network 230 and request access to the objects stored therein.

In another networked environment, the design automation tool may be executed on a network capable client and access the layout, pattern libraries and other objects stored in memory storage via a network and communications server.

Figure 3:
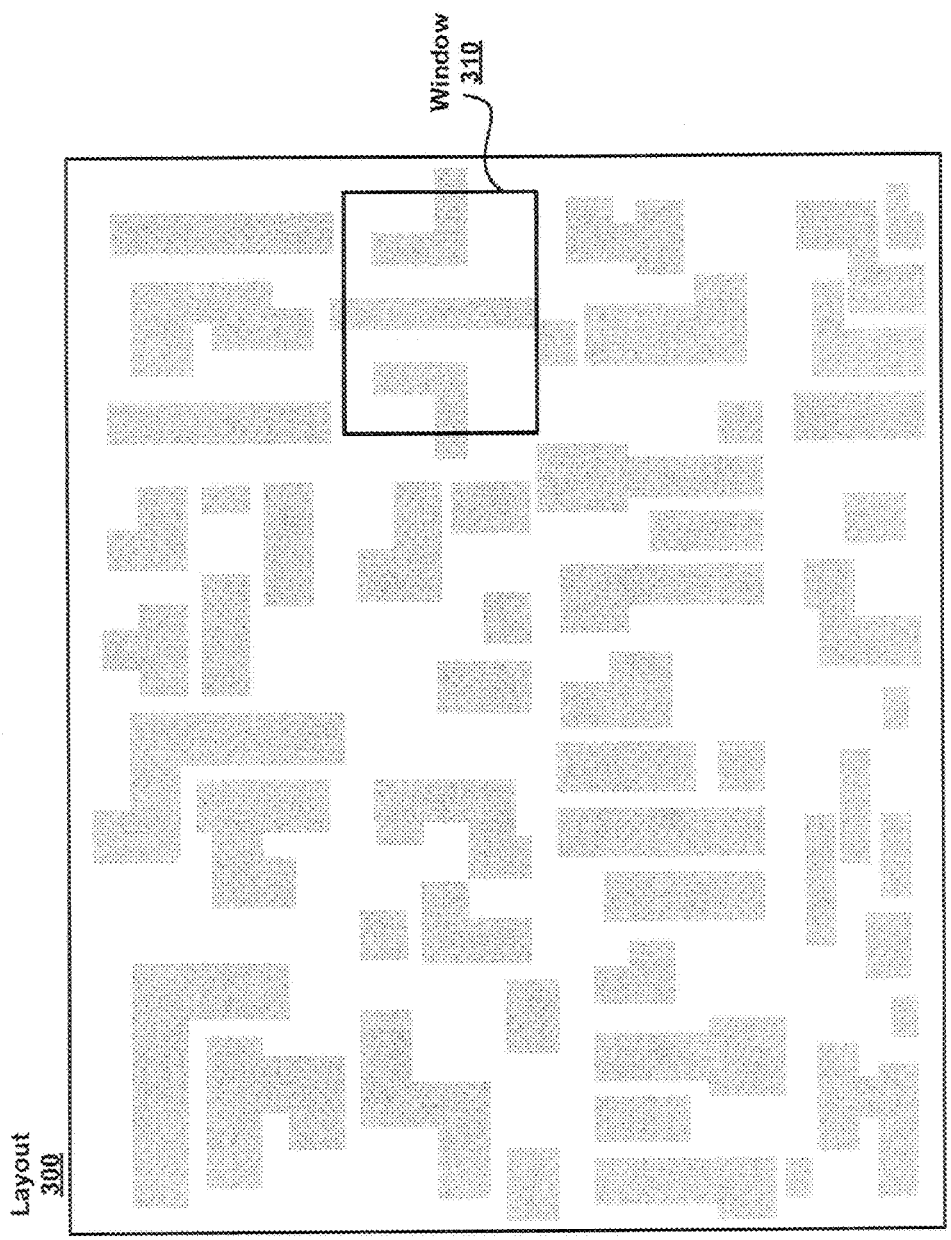
FIG. 3 illustrates an exemplary design layout for squish pattern analysis according to an embodiment.

FIG. 3 illustrates an exemplary design layout 300 for squish pattern analysis according to an embodiment. To identify the squish patterns in an IC design layout 300 using an analysis and validation tool, multiple windows for squish pattern identification, each covering a portion of the layout 300, may be defined. The placement of identification windows in the layout 300 may vary according to a placement technique defined by the analysis and validation tool. For example, the location and placement of windows may be determined by characteristics of the layout, the type of anchor being used for the identification windows, the location of the anchors, or a default or predetermined setting of the analysis and validation tool. The identification windows may be placed with a predetermined width and height. For example, the identification windows may cover 150 nm in each of the horizontal and vertical directions from the center of the window.

In some placement techniques, the identification of anchors in the layout 300 may determine the placement of the identification windows. The analysis and validation tool may scan the layout 300 and identify each anchor point around which an identification window may be placed. The identification windows may be centered on the anchors, placed such that a corner of a window rests on an anchor, or otherwise placed according to the determined placement technique.

An anchor may be a corner in the layout, an edge, a line end, a line center, a subset of cutlines, a jog, or another definable and detectable aspect of the layout 300 that may be used to align an identified squish pattern with the corresponding identification window. Although any of several different anchor types may be used when analyzing a layout for squish patterns, using a single anchor type for a layout may facilitate the most coverage of the layout 300.

The anchor type selected for layout analysis may be chosen dynamically or may be set by default. The analysis and validation tool may assess a layout and determine that a specific anchor type may be best suited to the particular layout. Additionally, the anchor types may be ranked such that if the first ranked layout type is not an appropriate anchor type, a second anchor type may be tried, and a third until an appropriate anchor type for the layout is identified. An anchor type may additionally be selected to provide the greatest possible identification window coverage of the layout 300 in order to identify as many squish patterns in the layout as possible.

Once an identification window 310 is defined, the shapes in the window may be identified and analyzed for "squish" patterns. A squish pattern is a representation of a geometry or configuration of shapes that identifies unique topologies without specifying the specific dimensions of the shapes in the topology. A single topology represented by a squish pattern may reflect several different geometries or configurations.

Figure 4:
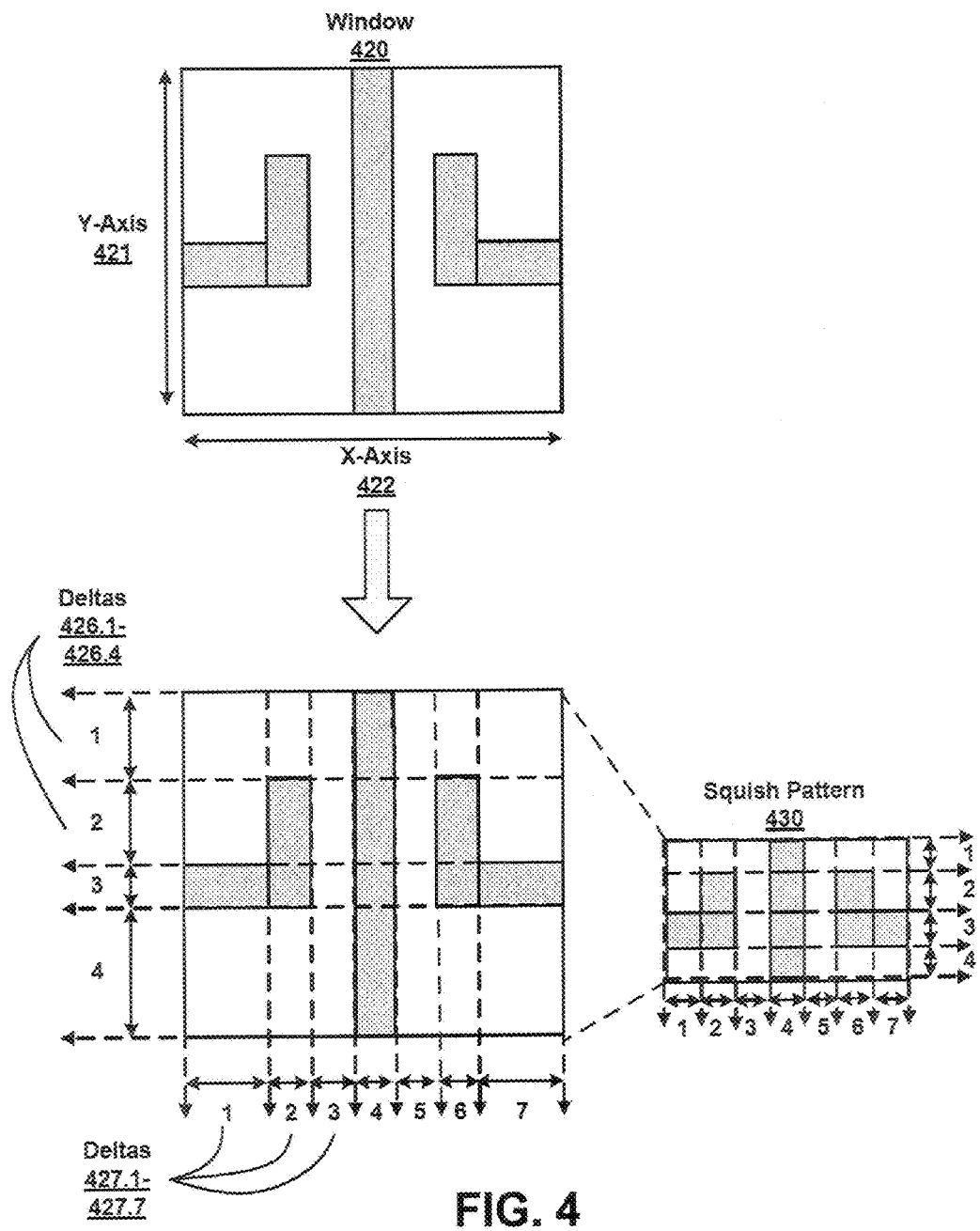
FIG. 4 illustrates an exemplary squish pattern analysis for an exemplary identification window in a layout according to an embodiment.

FIG. 4 illustrates an exemplary squish pattern analysis for an exemplary identification window 420 according to an embodiment. To identify the squish pattern of the configuration of shapes in the identification window, the deltas for the shapes in the identification window may first be identified. According to an embodiment, a delta may be the distance between scan lines containing an element edge in the identification window 420. The deltas identified on the X-axis 422 of the identification window 420 with the deltas identified on the Y-axis 421 of the identification window 420 may entirely describe the size and configuration of the shapes in the identification window 420.

As shown in FIG. 4, exemplary identification window 420 has four deltas 426.1-426.4 on the vertical, Y-axis 421 and seven deltas 427.1-427.7 on the horizontal, X-axis 422. To identify the squish pattern in the identification window 420, the size of each delta 426, 427 is separated from the topology of the configuration. Thus, as shown in squish pattern 430, the four vertical and seven horizontal deltas are each reduced to the same size. Each delta may be reduced to a single scan line and each squish pattern may be represented by a pixel map such that each pixel in the pixel map corresponds to a reduced delta in the squish pattern. By reducing the shapes in the configuration to a squish pattern without reference to the unique dimensions of each configuration, the analysis and validation tool may focus on a smaller subset of topologies for pattern matching and validation to identify potential problems.

Figure 5:
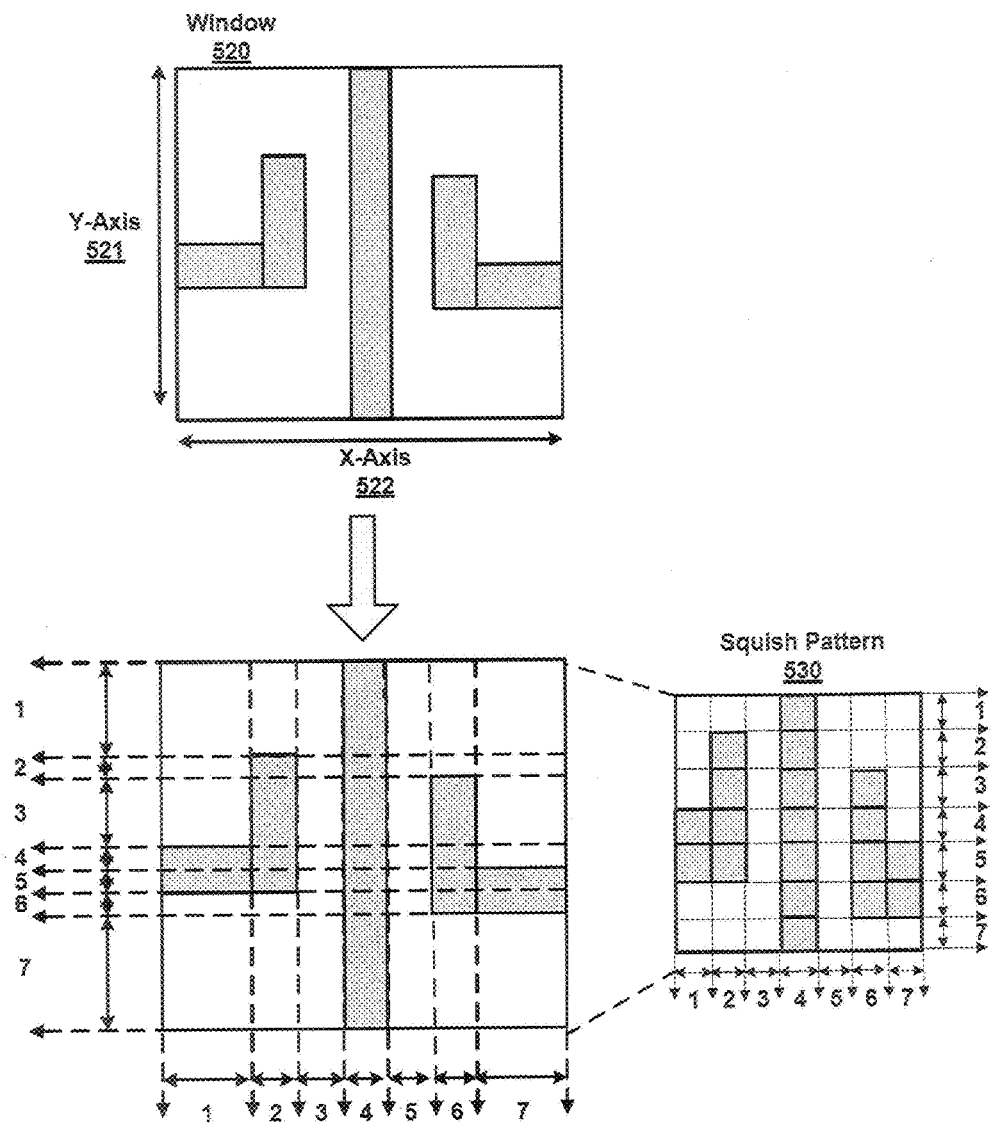
FIG. 5 illustrates an exemplary squish pattern analysis for an exemplary identification window in a layout according to an embodiment.

FIG. 5 illustrates another exemplary squish pattern analysis for another exemplary identification window 520 according to an embodiment. As shown in identification window 520, the alignment of the element edges in the identification window may have a significant effect on the identified squish pattern 530. As shown in window 520, a small alignment shift (as compared to the configuration in identification window 420 in FIG. 4) may create several additional deltas. Identification window 520 has seven deltas on the vertical, Y-axis 521 and seven deltas on the horizontal, X-axis 522. The corresponding squish pattern 530 for the configuration in identification window 520 is shown.

Figure 6:
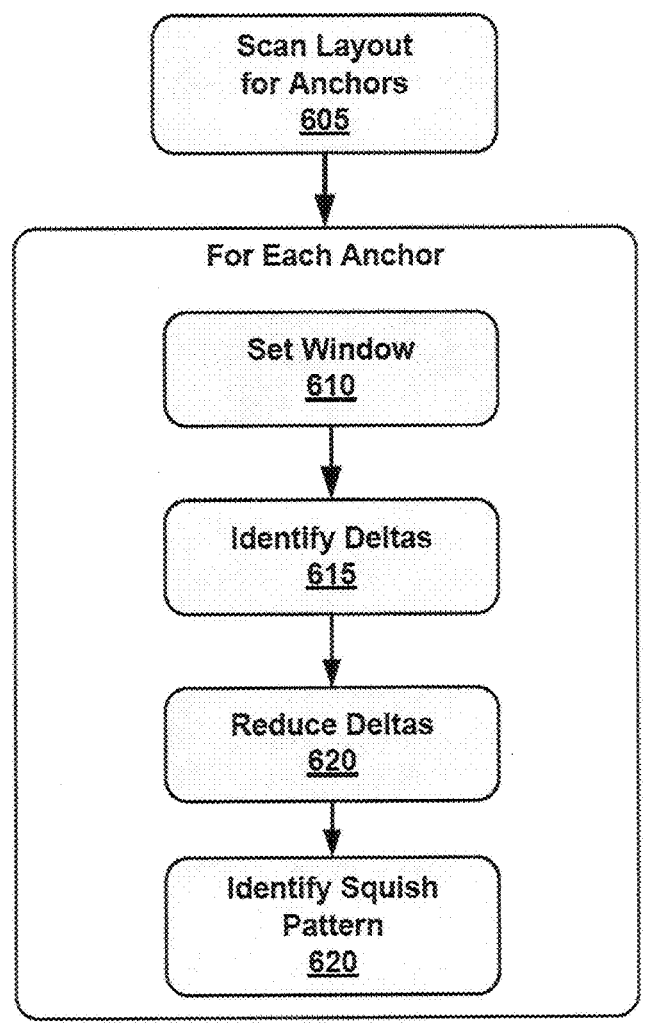
FIG. 6 is a simplified flow diagram illustrating an exemplary method for identifying squish patterns in a layout according to an embodiment

FIG. 6 is a simplified flow diagram illustrating an exemplary method for identifying squish patterns in a layout. As shown in FIG. 6, to identify the squish patterns in a layout, an analysis and validation tool may scan the layout to identify anchors (block 605). For each anchor identified in the layout, a window may be set around the anchor (block 610). The configuration of shapes in the identification window may then be analyzed to identify an appropriate squish pattern. The element edges and the corresponding deltas may be identified to determine the configuration of the shapes in the identification window (block 615). The deltas may then be reduced to a consistent size (block 620). The topology of the shapes with the reduced deltas may then be identified as the squish pattern for the identification window (block 625).

Once a squish pattern is identified, it may be stored in memory and associated with the layout or matched with a known squish pattern. Then for every identification window that has a squish pattern consistent with the identified squish pattern, a record may be created detailing the original configuration and deltas. The record may include information such as the dimension of each delta, the types of shapes and connections in the identification window, the anchor for the identification window, or the other parameters of the identification window. Using this information stored for each configuration and squish pattern, statistics about the identified squish patterns may be collected and analyzed.

Figure 7:
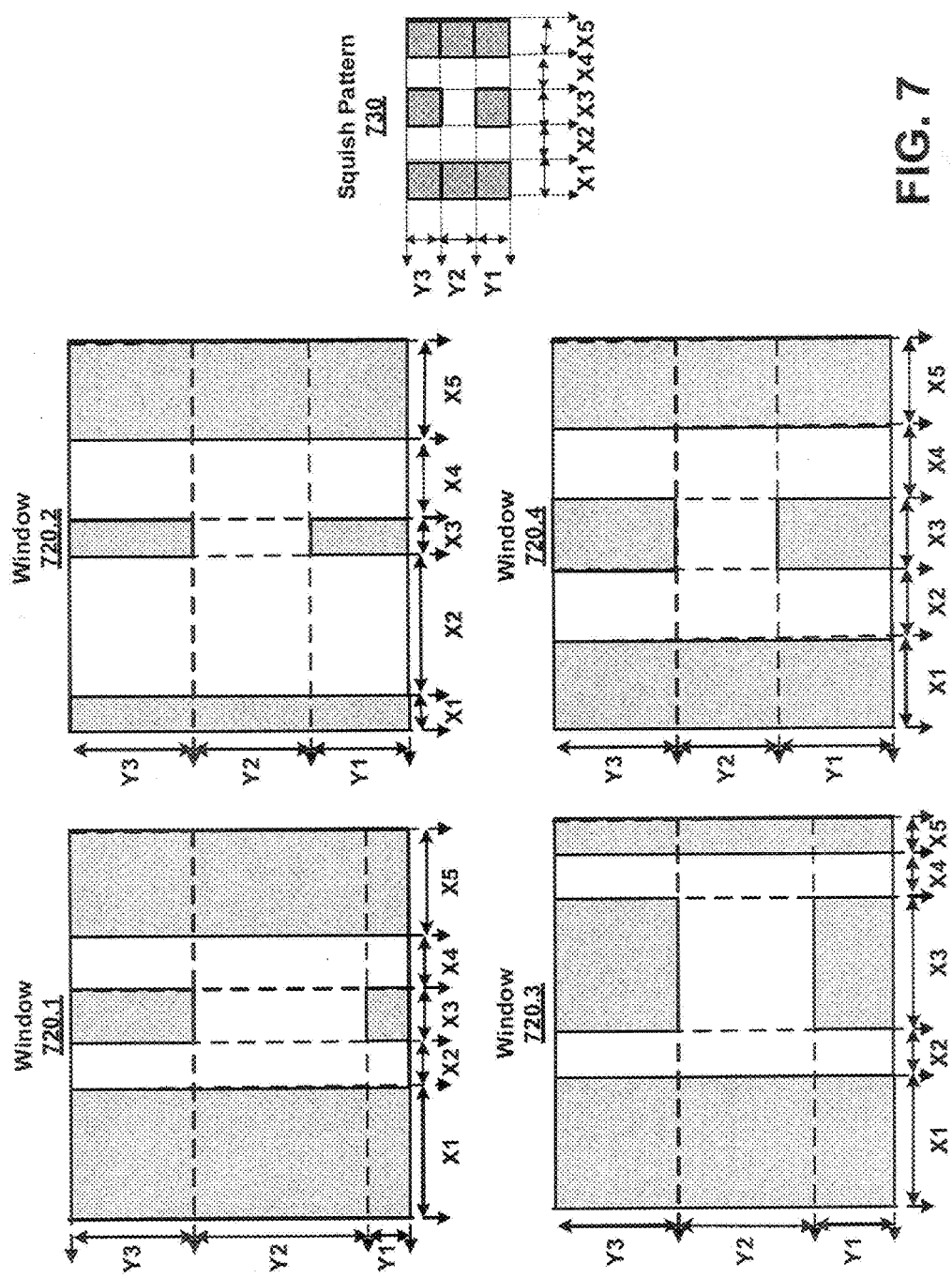
FIG. 7 illustrates exemplary identification windows represented by a single squish pattern according to an embodiment.

FIG. 7 illustrates exemplary identification windows 720.1-720.4 that may be represented by a single squish pattern 730. Then an analysis of the squish patterns in a layout containing all four identification windows 720.1-720.4 may create statistics providing details for the identification windows containing the identified squish pattern 730. For example, for the squish pattern 730, a table such as the one shown in Table 1 may be created providing details about the configurations that correspond to the identified squish pattern 730, including identification windows 720.1-720.4 and any other identification windows corresponding to squish pattern 730.

TABLE 1

|  | X1 | X2 | X3 | X4 | X5 | Y1 | Y2 | Y3 |
|---|---|---|---|---|---|---|---|---|
| Num | 98 | 120 | 2 | 120 | 90 | 104 | 104 | 2 |
| Min | 2 | 95 | 100 | 100 | 2 | 2 | 142 | 300 |
| Max | 120 | 298 | 100 | 298 | 106 | 158 | 298 | 300 |

The columns X1-Y3 of Table 1 identify the deltas in configurations corresponding to squish pattern 730. The Num row indicates the number of unique delta values identified for the respective delta in the configurations corresponding to squish pattern 730. The Min and Max rows indicate the minimum and maximum size of the respective delta for the configurations corresponding to squish pattern 730 in the layout. For example, in exemplary Table 1, the X1 delta has 98 different unique values in the analyzed layout, with a minimum identified dimension of 2 units and a maximum identified dimension of 120 units. The units used for reporting deltas may be the minimum measurement that is used in the layout, for example, the deltas may be reported in nanometers (nm). However, any minimum unit of measurement appropriate for the layout may be used. The unit type may be set dynamically by the validation tool when storing the squish pattern records in memory, or may be predetermined, for example, by the layout designer.

Additional information may be collected and stored with the squish pattern statistics. For example, the squish pattern may be associated with a unique ID to uniquely identify all records concerning the squish pattern in the system, the dimensions of the window analyzed to identify the squish pattern, the number of sequences or identification windows that correspond to the identified squish pattern, or the number of unique sequences or configurations that correspond to the identified squish pattern. Then if the number of sequences for a squish pattern is significantly higher than the number of unique configurations for the squish pattern, the identified squish pattern may represent a configuration of shapes for a common component or element repeated often in the layout.

The collected statistics may additionally be used to validate the layout and to identify potential problem areas in the layout. For example, if the minimum width or height for a shape on the layout is known, the analysis and validation tool may identify any identification windows that contain the shape with a delta below the dimension minimum. For example, referring to Table 1, if the minimum width is 100 units, then the Min value for X2 of 95 units may be identified as a potential error, or otherwise cause the layout to fail pattern validation.

A set of squish patterns may be searched to identify a specific squish pattern, a specific configuration, or configurations having delta dimensions within a specified range. For example, identifying the squish patterns in a layout and collecting statistics about the identified squish patterns may facilitate searching for a certain configuration in a large complex layout by limiting the number of unique patterns or configurations that need to be searched. To search for a specific configuration, the specific configuration may first be analyzed to identify the squish pattern for the specific configuration. Then the known squish patterns may be evaluated to determine if the squish pattern was previously identified in the layout. Once a matching squish pattern is identified, the search may be limited to the configuration records for the identified squish pattern, thereby substantially limiting the number of records to be searched. Then, to determine if the specific configuration is used in the layout, the deltas for the configurations corresponding to the identified squish pattern are searched to find deltas corresponding to the specific configuration.

For example, for the identified squish pattern 730, there may be an associated record for each of the configurations shown in identification windows 720.1-720.4. Table 2 illustrates an exemplary table consisting of the dimension records for the configurations shown in FIG. 7. Then a search that identifies squish pattern 730 as the search squish pattern may step through the records of Table 2 to determine if the deltas for any of configurations 720.1-720.4 match the searched for deltas or delta ranges.

TABLE 2

|  | X1 | X2 | X3 | X4 | X5 | Y1 | Y2 | Y3 |
|---|---|---|---|---|---|---|---|---|
| 720.1 | 150 | 50 | 50 | 50 | 150 | 150 | 250 | 50 |
| 720.2 | 50 | 200 | 50 | 75 | 75 | 150 | 150 | 150 |
| 720.3 | 150 | 50 | 150 | 50 | 50 | 150 | 200 | 100 |
| 720.4 | 100 | 75 | 100 | 75 | 100 | 150 | 150 | 150 |

Figure 8:
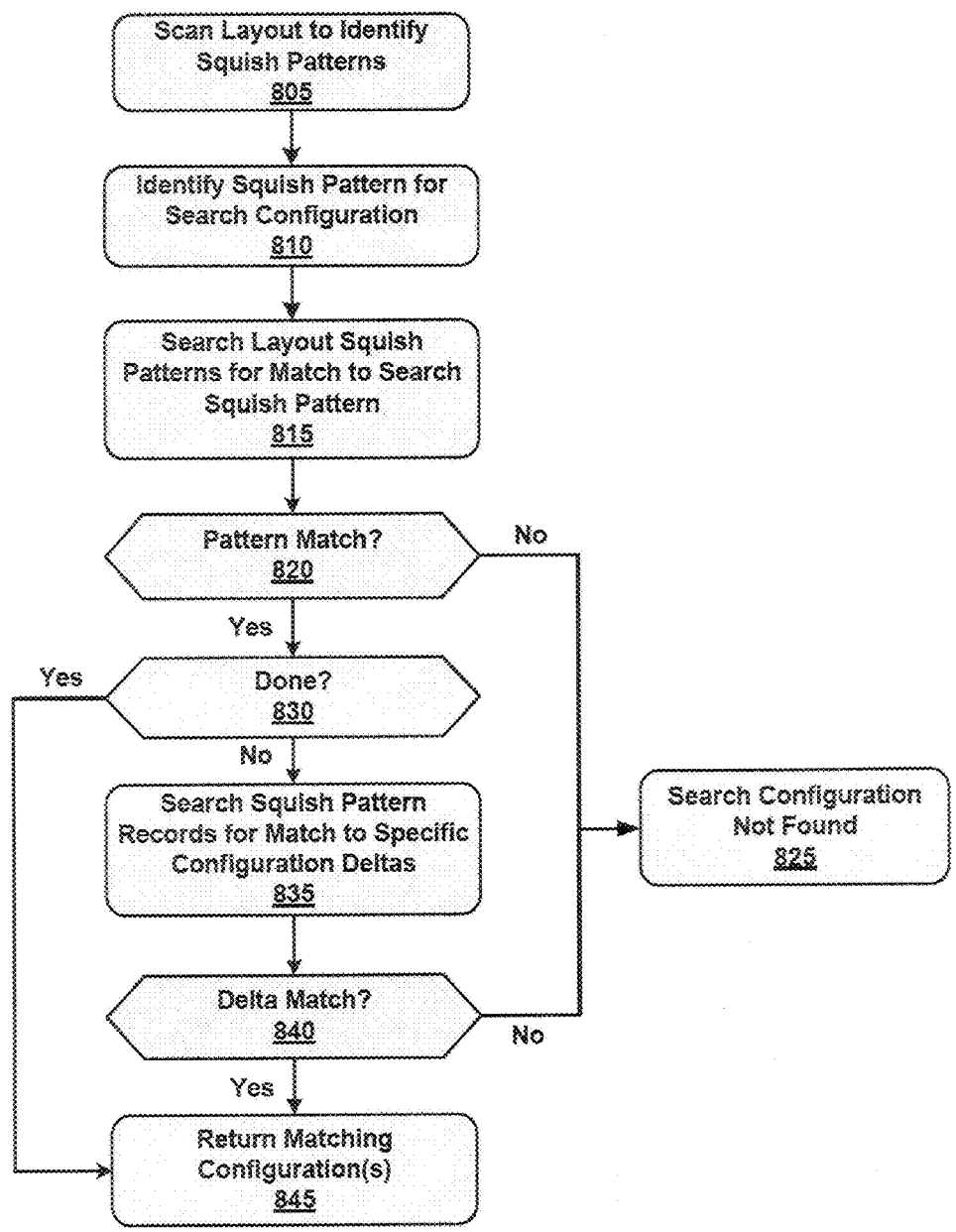
FIG. 8 is a simplified flow diagram illustrating an exemplary method for searching a layout for a specific configuration of shapes according to an embodiment.

FIG. 8 is a simplified flow diagram illustrating an exemplary method for searching a layout for a specific configuration according to an embodiment. Initially, a layout may be analyzed and the squish patterns in the layout may be identified (block 805). The identified squish patterns and the relevant statistics and configuration information may be stored for future access as previously noted. Then, to search for a specific configuration within the layout, the squish pattern of the specific configuration may be determined as previously described, by separating the topology of the search configuration from the dimensions of the deltas in the search configuration (block 810).

Then, after all the relevant squish patterns have been identified, the squish patterns identified in the layout may be searched to determine if the squish pattern for the specific configuration exists in the layout (block 815). If the squish pattern for the specific configuration does not exist in the set of layout squish patterns (block 820), then the specific configuration does not exist in the layout (block 825). However, if the squish pattern for the specific configuration does exist in the set of layout squish patterns (block 820), then if the search was for the squish pattern generally, the search is complete (block 830) and all the configurations associated with the found squish pattern may be returned or marked as matching the search request (block 845).

If the search was for a specific configuration or a configuration having a delta within a specified range, then the search is not yet complete (block 830) and the individual configuration records associated with the identified squish pattern may be searched to identify a configuration with the appropriate deltas (block 835). If no configuration record associated with the searched squish pattern has the same deltas as the specific configuration (block 840), then the specific configuration does not exist in the layout (block 825). However, if there is one or more configuration record associated with the identified squish pattern that has the appropriate deltas (block 840), each such configuration may be marked or returned as a match to the specific configuration (block 845).

The specific configuration searched may contain a range of appropriate delta values in order to search for a number of similar configurations all having the same associated squish pattern. For example, the specific configuration may include a delta between a minimum search value and a maximum search value, then each configuration in the set of squish patterns associated with the layout may be evaluated to determine if the specified delta is within the minimum and maximum search values (block 840).

According to an aspect of an embodiment, the search function may be facilitated with a hash function. The squish pattern may be represented by a bit map, for example, if the reduced deltas of the squish patterns are limited to a single scanline, then a hash value for the associated squish pattern may be determined. Searching for a specific squish pattern may then be accomplished by determining the hash value of the specific squish pattern and performing a lookup for the determined hash value.

For multi-layer layouts, each pixel in the pixel map for a given squish pattern may have a bit associated with each layer. Then all the bits for each layer of the pixel map may be included in the hash function to designate a unique hash value for the multi-layer squish pattern.

A layout that has been analyzed to identify the squish patterns existent in the layout may then be evaluated to determine the validity of the squish patterns and assessed to determine the layout printability. A validation tool may automatically step through the squish patterns identified in the layout and determine if the layout will pass simulation or if any of the identified squish patterns may have known issues or otherwise have problems during manufacture.

Validation may include matching the squish patterns in a layout to known bad patterns. A set of known bad patterns may be stored in a database or other memory storage accessible by the validation tool. Then either each bad pattern in the bad pattern store may be searched in the layout set to determine if any of the known bad patterns exist in the set of layout squish patterns, or each stored squish pattern associated with a layout may be searched in the bad pattern store to determine if any of the layout squish patterns are known bad patterns. The known bad patterns may be limited to a single configuration having specific delta dimensions, may be limited to configurations having delta dimensions within a specified range, or may generically identify a squish pattern that is "bad" for any configuration having the specified squish pattern.

An identified squish pattern in the layout set that is a known bad pattern may be flagged as having a potential validation problem. Then the layout designer may review the flagged squish patterns to fix the problem pattern if necessary. Alternatively, a validation tool may attempt to automatically fix or adjust the problem patterns. Fixing the problem configuration may include identifying a replacement configuration or squish pattern that is either known to be a good pattern or that is a not in the bad pattern store.

The bad pattern store may be populated by a set of squish patterns or configurations received from the foundry to set limitations on the types of layouts that may be manufactured. The bad pattern store may additionally be populated by other IC designers by adding squish patterns to the bad pattern store when a new configuration or squish pattern is proven to be "bad" or when identified as problematic during simulation, printing, or other validation procedures. Furthermore, as layouts undergo simulation, and configurations are identified that may create problems, the squish pattern of the identified configuration as well as the problematic delta dimensions may be determined and automatically added to the bad pattern store. Such accumulation may occur automatically by the validation tool.

Figure 9:
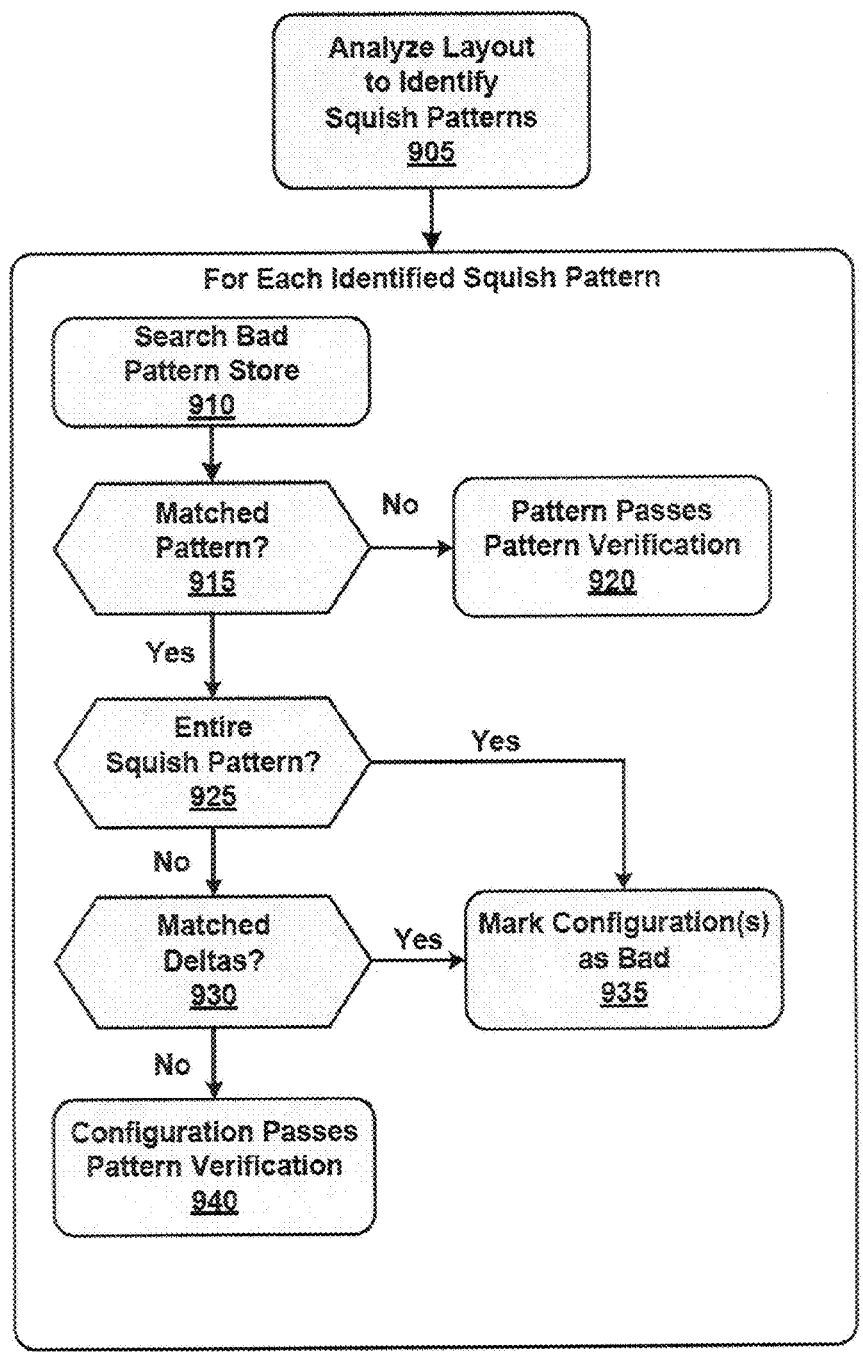
FIG. 9 is a simplified flow diagram illustrating an exemplary method for analyzing a layout for bad patterns according to an embodiment.

FIG. 9 is a simplified flow diagram illustrating an exemplary method for analyzing a layout for bad patterns according to an embodiment. Initially, a layout may be analyzed and the squish patterns in the layout may be identified (block 905). Then, for each identified squish pattern in the layout, the identified squish pattern may be searched in the bad pattern store (block 910). If the identified layout squish pattern does not exist in the bad pattern store (block 915), then none of the configurations in the layout corresponding to the identified layout squish pattern are known bad patterns and each of those configurations may be known to pass bad pattern validation (block 920). However, if the identified layout squish pattern does exist in the bad pattern store (block 915), then if the bad pattern store includes the squish pattern generally (block 925), all the configurations associated with the found squish pattern may be returned or marked as bad (block 935).

If the bad pattern does not identify the squish pattern generally but rather identifies a specific configuration or configurations having a delta within a specified range (block 925), then the individual configuration records associated with the identified layout squish pattern may be searched to identify a configuration with deltas consistent with the bad pattern(s) (block 930). If a configuration record associated with the identified layout squish pattern has the same deltas as the bad pattern (block 930), then that specific configuration may be returned or marked as bad (block 935). However, any configuration record associated with the identified layout squish pattern that does not have the same deltas as the bad pattern (block 930) may be known to pass bad pattern validation (block 940). Then the known bad configurations may be marked or flagged for further review or be corrected by a validation tool.

Similarly, validation may include matching the identified squish patterns in a layout to known good patterns. A set of good patterns may be stored in a database or other storage medium accessible by a validation tool. Then each identified squish pattern in the layout may be compared to the good patterns in the good pattern store to determine if the identified squish patterns are known good patterns. The known good patterns may be limited to a single configuration having specific delta dimensions, may be limited to configurations having delta dimensions within a specified range, or may identify a squish pattern that is "good" for any configuration having the specified squish pattern within a layout window of a known size. Identified squish patterns in the layout set not found in the good pattern store may be identified for further validation, including a simulation to assess printability of the configurations.

The good pattern store may be populated by a set of squish patterns or configurations received from the foundry to enumerate the types of layouts and configurations that the foundry may guarantee will be properly manufactured. The good pattern store may additionally be populated by other designers or automatically by the validation tool when a new configuration or squish pattern successfully passes simulation or a test printing.

Limiting the layout to a relatively small set of squish patterns as defined in a good pattern store and forbidding all other squish patterns may dramatically reduce the total number of unique configurations and create more regular designs. Additionally, by limiting the squish patterns in a layout to the squish patterns in a library of good patterns, it will be easier to guarantee manufacturability.

The squish patterns identified in a good pattern store may additionally be used to facilitate the design process. For example, the patterns in the good pattern store may be characterized by element type, or specific elements may be associated with one or more squish patterns in the good pattern store. Then a user may utilize a design tool to place an element in a layout. The placed layout may then consist of configurations from the known good pattern store thereby ensuring that the placed element will pass the validation process.

For example, a subset of inverter types may be stored in the good pattern store. When a design tool user requests an inverter be placed in the layout, that subset of inverters may be displayed for selection by the user. Similarly, exemplary parameterized cells, or predefined cells that have adjustable parameters and are known good patterns may be placed in a layout with a defined parameter upon request of a design tool user. The parameterized cell may have known good patterns for only a range of the parameter and may not allow the designer to place a cell with a parameter outside of the known good pattern range.

Figure 10:
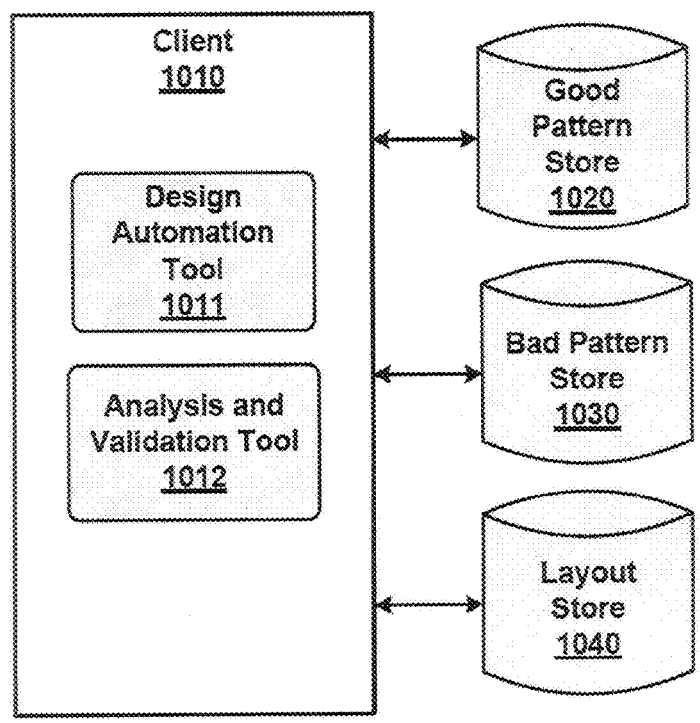
FIG. 10 is a simple block diagram illustrating components of an exemplary system according to an embodiment.

FIG. 10 is a simple block diagram illustrating components of an exemplary system according to an embodiment. As shown in FIG. 10, a client 1010 running a design automation tool 1011 may have access to memory storage and pattern libraries. For example, as shown, the client 1010 may have access to a good pattern store 1020, a bad pattern store 1030, and a layout or pattern store 1040 to store the information for each layout and identified squish pattern in each layout. Then an analysis and validation tool 1012 may access a good pattern store 1020, a bad pattern store 1030, and a layout or pattern store 1040 to analyze the layouts and validate layout designs.

Although primarily described implementing steps for validation, squish patterns may have applicability for any IC design function that relies on pattern identification, pattern matching or otherwise utilizes known patterns. Including, for example, retargeting during mask creation or routing and the creation of router instructions for a layout using the abstract patterns of the identified or placed squish patterns.

In some applications, the modules described hereinabove may be provided as elements of an integrated software system, in which the blocks may be provided as separate elements of a computer program. Some embodiments may be implemented, for example, using a computer-readable storage medium or article which may store an instruction or a set of instructions that, if executed by a processor, may cause the processor to perform a method in accordance with the embodiments. Other applications of the present invention may be embodied as a hybrid system of dedicated hardware and software components. Moreover, not all of the modules described herein need be provided or need be provided as separate units. For example, although the design automation tool 1011 and the analysis and validation tool 1012 are shown in FIG. 10 as separate tools, they may be included in a single application, program, or tool or in several different applications, programs or tools. Additionally, it is noted that the arrangement of the blocks in FIGS. 6, 8 and 9 do not necessarily imply a particular order or sequence of events, nor are they intended to exclude other possibilities. For example, the operations depicted at blocks 805 and 810 may occur in any order or substantially simultaneously with each other. Such implementation details are immaterial to the operation of the present invention unless otherwise noted above.

The exemplary methods and computer program instructions may be embodied on a non-transitory computer-readable or other machine readable storage medium such as a computer disc, optically-readable media, magnetic media, hard drives, RAID storage device, and flash memory. In addition, a server or database server may include machine readable media configured to store machine executable program instructions. The features of the embodiments of the present invention may be implemented in hardware, software, firmware, or a combination thereof and utilized in systems, subsystems, components or subcomponents thereof. The "machine readable storage media" may include any medium that can store information. Examples of a machine readable storage medium include electronic circuits, semiconductor memory device, ROM, flash memory, erasable ROM (EROM), floppy diskette, CD-ROM, optical disk, hard disk, fiber optic medium, or any electromagnetic or optical storage device.

While the invention has been described in detail above with reference to some embodiments, variations within the scope and spirit of the invention will be apparent to those of ordinary skill in the art. Thus, the invention should be considered as limited only by the scope of the appended claims.

What is claimed is:

1. A method for using a processor to identify a squish pattern in an integrated circuit design layout, the method comprising:
   upon input of the design layout, identifying with the processor an anchor in the design layout;
   defining, with the processor, a window for the anchor comprising elements of the design layout;
   identifying, with the processor, a delta between every adjacent scan line in the window that contains an element edge;

reducing, with the processor, each delta to the same width, the plurality of reduced deltas forming a squish pattern for the window, and storing a record comprising original dimensions for the plurality of deltas with the squish pattern in a memory storage device.

2. The method of claim 1, wherein the squish pattern is represented by a pixel map and each reduced delta is represented by a pixel.

3. The method of claim 2, wherein each pixel in said pixel map includes a bit corresponding to a layer in a multi-layer design layout.

4. The method of claim 1, further comprising analyzing collected statistics for the squish pattern in the design layout to determine if the window fails validation.

5. The method of claim 1, further comprising searching a plurality of squish patterns for the identified squish pattern.

6. The method of claim 5, further comprising, upon finding a matching squish pattern in the plurality of squish patterns, searching a plurality of records associated with the found squish pattern for a record corresponding to a window having a delta within a specified range of an identified delta in the identified squish pattern.

7. The method of claim 5, wherein said searching comprises determining a hash value for the identified squish pattern.

8. The method of claim 1, further comprising comparing the identified squish pattern to a set of known patterns.

9. The method of claim 8, wherein the set of known patterns includes a set of known bad patterns.

10. The method of claim 9, further comprising:
flagging the window if the identified squish pattern is in the set of known patterns.

11. The method of claim 10, wherein said flagging indicates that the window has failed validation.

12. The method of claim 9, further comprising:
flagging the window if both the identified squish pattern and the identified plurality of deltas is in the set of known patterns.

13. The method of claim 8, wherein the set of known patterns includes a set of known good patterns.

14. The method of claim 13, further comprising:
flagging the window if the identified squish pattern is not in the set of known patterns.

15. The method of claim 14, wherein said flagging indicates that the window requires additional validation.

16. The method of claim 13, further comprising:
flagging the window if both the identified squish pattern and the identified plurality of deltas is not in the set of known patterns.

17. The method of claim 13, further comprising verifying that an element has a known good pattern before adding the element to the layout.

18. A non-transitory computer readable medium storing instructions that when executed by a processor perform a method of using a processor to identify a squish pattern for a layout, the method comprising:
identifying an anchor in the layout;
defining a window for the anchor covering an area comprising elements of the layout;
identifying a delta between every adjacent scan line in the window that contains an element edge; and
reducing each delta to the same width, the plurality of reduced deltas forming a squish pattern for the window.

19. A system comprising:
a memory to store a plurality of known patterns;
a controller to:
identify a squish pattern in a layout, by:
identifying an anchor in the layout,
defining a window for the anchor covering an area comprising elements of the layout,
identifying a delta between every adjacent scan line in the window that contains an element edge
reducing each delta to the same width, the plurality of reduced deltas forming a squish pattern for the window, and
compare the identified squish pattern to a set of known patterns; and
a user interface to display the layout and a result of the comparison of the identified squish pattern to the set of known patterns.

* * * * *